United States Patent
Matsunaga

(10) Patent No.: US 9,390,000 B2
(45) Date of Patent: Jul. 12, 2016

(54) MEMORY SYSTEM IN WHICH DATA IS WRITTEN TO MEMORY CHIPS BASED ON A DISTANCE FROM A MEMORY CONTROLLER

(71) Applicant: Kabushiki Kaisha Toshiba, Tokyo (JP)

(72) Inventor: Naoki Matsunaga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 13/742,693

(22) Filed: Jan. 16, 2013

(65) Prior Publication Data

US 2014/0068146 A1 Mar. 6, 2014

(30) Foreign Application Priority Data

Sep. 6, 2012 (JP) .................................. 2012-196157

(51) Int. Cl.
  *G06F 12/02* (2006.01)
  *G11C 5/04* (2006.01)

(52) U.S. Cl.
  CPC .............. *G06F 12/0246* (2013.01); *G11C 5/04* (2013.01); *G06F 2212/1032* (2013.01); *G06F 2212/1036* (2013.01); *G06F 2212/7208* (2013.01); *G06F 2212/7211* (2013.01)

(58) Field of Classification Search
  CPC .................... G06F 12/0246; G06F 2212/1032; G06F 2212/1036; G06F 2212/7208; G06F 2212/7211; G11C 5/04; G11C 5/00
  USPC .......................... 711/5, 103; 365/51, 211, 212
  See application file for complete search history.

(56) References Cited

U.S. PATENT DOCUMENTS

| | | | |
|---|---|---|---|
| 6,349,050 B1 * | 2/2002 | Woo et al. ........................ | 365/51 |
| 7,653,778 B2 * | 1/2010 | Merry et al. ................... | 711/103 |
| 7,760,496 B2 * | 7/2010 | Tsukazawa ............... | 361/679.48 |
| 7,948,798 B1 * | 5/2011 | Sheredy et al. .......... | 365/185.11 |
| 2007/0127223 A1 | 6/2007 | Mitsuhashi | |
| 2008/0235432 A1 * | 9/2008 | Chen et al. ..................... | 711/100 |
| 2009/0144475 A1 * | 6/2009 | Park .............................. | 710/301 |
| 2010/0122016 A1 * | 5/2010 | Marotta et al. ................ | 711/103 |
| 2011/0103027 A1 | 5/2011 | Aoki et al. | |

FOREIGN PATENT DOCUMENTS

| | | |
|---|---|---|
| JP | 2007-156682 | 6/2007 |
| JP | 2008-003820 | 1/2008 |
| JP | 2011-003018 | 1/2011 |
| JP | 2011-095961 | 5/2011 |
| JP | 2011-134138 | 7/2011 |

* cited by examiner

*Primary Examiner* — Sanjiv Shah
*Assistant Examiner* — Glenn Gossage
(74) *Attorney, Agent, or Firm* — Patterson & Sheridan, LLP

(57) ABSTRACT

A memory device includes a substrate, a plurality of nonvolatile memory chips disposed on the substrate, and a memory controller disposed on the substrate. The memory chips may be disposed on the same side or the opposite side of the substrate as the memory controller. The memory controller controls each of the nonvolatile memory chips based on a firmware, where the firmware is written in a nonvolatile memory chip positioned at a location farthest from the memory controller. A write system may perform writing using a binary or single level cell (SLC) recording system in memory chips located closest to the memory controller and a multi-value or multi-level cell (MLC) recording system in memory chips located farthest from the memory controller. A weighting factor may be assigned for each of the nonvolatile memory chips based on the distance from the memory controller.

10 Claims, 11 Drawing Sheets

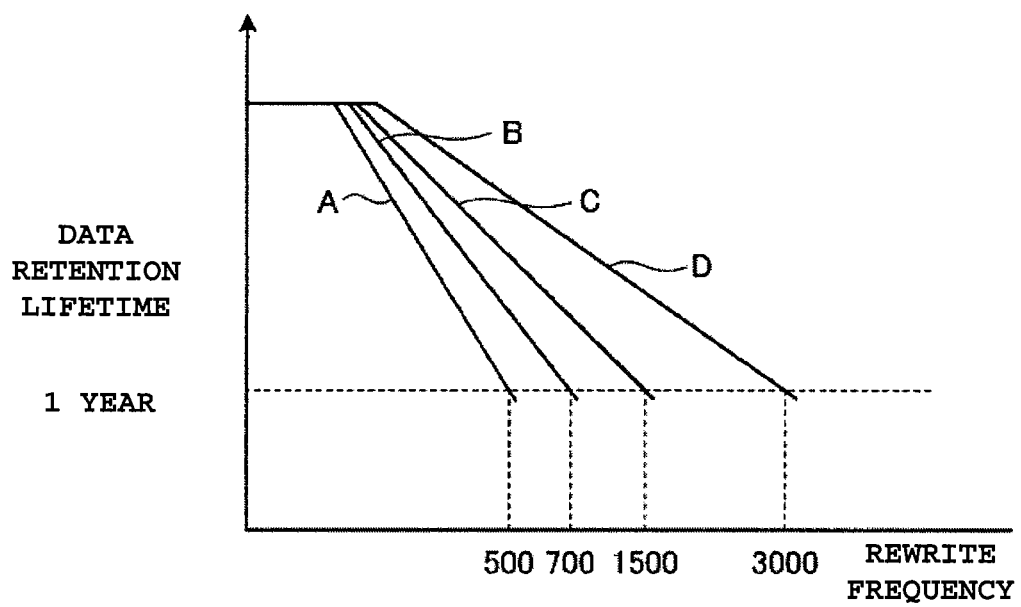

MEMORY SYSTEM IN WHICH DATA IS WRITTEN TO MEMORY CHIPS BASED ON A DISTANCE FROM A MEMORY CONTROLLER

CROSS-REFERENCE TO RELATED APPLICATION

This application is based upon and claims the benefit of priority from Japanese Patent Application No. 2012-196157, filed Sep. 6, 2012; the entire contents of which are incorporated herein by reference.

FIELD

Embodiments described herein relate generally to a memory system.

BACKGROUND

Along with improvements in the speed of nonvolatile semiconductor memory storage device, there is a corresponding increase in heat generation in the components of the device as well as an increase in power consumption by the device. Furthermore, with the miniaturization of the devices, components are now closer together, so even if the same quantity of heat is generated by a heat generating component in the device, it will be easy for other components to be subject to the influence of the heat due to the miniaturization of the device. Heat generation is significant in the portion of the controller of the device that is responsible for various tasks. The influence of heat from the controller on the reliability of the nonvolatile semiconductor memory storage device affects other components, which may shorten the lifetime of the other components and/or reduce the performance of other components.

DESCRIPTION OF THE DRAWINGS

FIG. 17 is a diagram that shows a dependence of a write frequency on data retention lifetime in the third embodiment.

FIG. 18 is a diagram that shows a weighting factor table of the third embodiment.

DETAILED DESCRIPTION

Embodiments of the disclosure provide a memory device that minimizes the influence of heat generated by a memory controller on other components of the memory device.

In general, according to one embodiment, a memory system is explained in detail below. The invention is not limited by this embodiment.

The memory system according to one embodiment is equipped with several nonvolatile memory chips and a memory controller that controls the nonvolatile memory chips based on a firmware. The firmware is written to the nonvolatile memory chips that are in the farthest location from the memory controller.

(First Embodiment)

Figure 1:
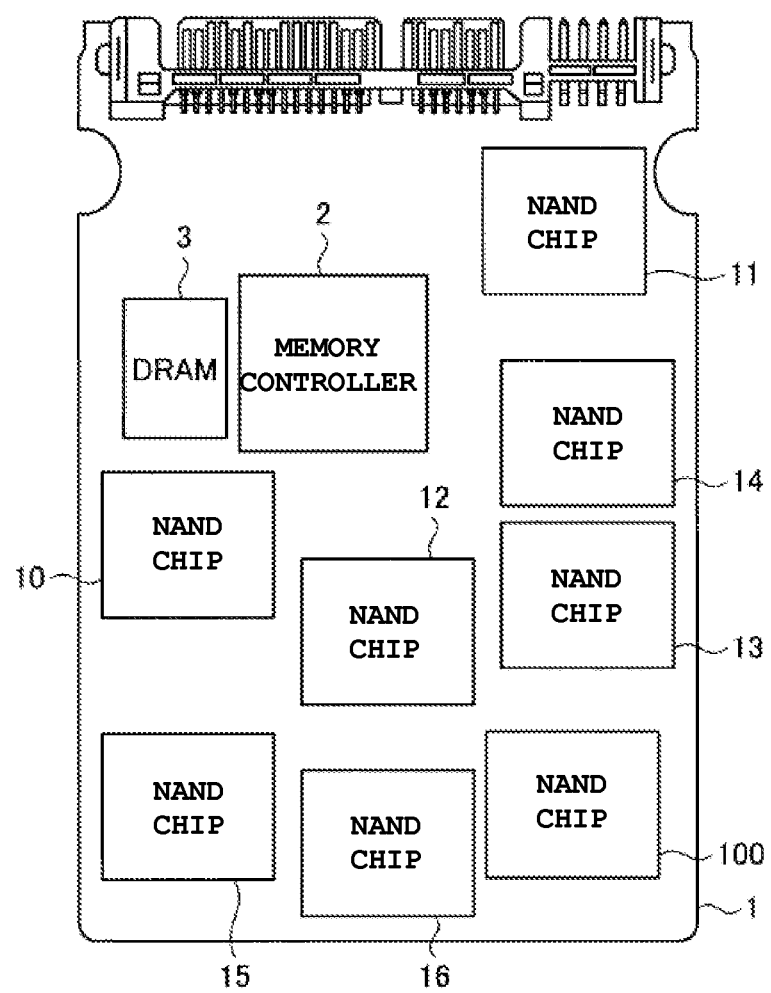
FIG. 1-FIG. 6 are schematic diagrams that show various configurations of a memory system according to one embodiment.

FIG. 1 is a diagram that shows a configuration of a memory system 1 (memory device) of the first embodiment. In the memory system 1, which is a nonvolatile semiconductor memory storage such as an SSD (Solid State Drive), a memory controller 2 is generally arranged in the position near a terminal through a power supply circuit (not shown), and NAND chips 10, 11, . . . , 16, 100 are arranged so that equivalent wiring may be maintained therebetween in locations on a substrate having no components. Here, the positions of several NAND chips 10, 11, . . . , 16, 100 from the controller 2 vary respectively.

Generally, the data retention performance of a non-volatile semiconductor is a function of temperature, and it is understood that the higher the temperature, the shorter the retention period will be. When taking into consideration the fact that the memory controller 2 generates the most heat among the components on the substrate of the memory system 1, it is considered that, of several NAND chips 10, 11, . . . , 16, 100, the NAND chip 10, which is located the nearest to the memory controller 2 and therefore, the most subject to thermal influence, will deteriorate easily, and the NAND chip 100, which is located the farthest from the memory controller 2 and therefore, the least subject to thermal influence, will hardly deteriorate.

Therefore, in this embodiment, the firmware (FW) that specifies the operation of the memory system 1, which is written at the time of shipment, is written in the NAND chip 100, which is located the farthest from the memory controller 2. The memory controller 2 controls the operation of the data writing, etc. to the NAND chips 10, 11, . . . , 16, 100, etc. based on the firmware. Moreover, management data, such as a logical-physical translation table showing correspondence with a logical address specified by a host and a physical address on a NAND chip, its change log, etc. are also written in the NAND chip 100, which is the farthest from the memory controller 2. Furthermore, a data writing method may be a multi-value recording (MLC: Multi-Level Cell) system of ternary, or higher, altogether. The data writing method may not only include the firmware, or management data, but also include the user data. The data writing method may also be a binary recording system (SLC: Single-Level Cell) in all. Moreover, in the NAND chip 100, only the firmware and management data may be written by a binary recording system, with the other being written by the multi-value recording system of ternary or higher. Furthermore, the NAND chip 100 may be written by the binary recording system, and other NAND chips may be written by the multi-value recording system of ternary or higher.

Although not shown, but understood by one of skill in the art, one NAND chip 100 has multiple blocks and each block is a data erase unit. Moreover, one block has several pages. Each page is a data write and read unit. Furthermore, each page has several memory cells. In the case of a multi-value recording system, it is possible to store several bits of data in a single memory cell. In the case of a binary recording system, it is possible to store 1 bit of data in a single memory cell.

Figure 4:
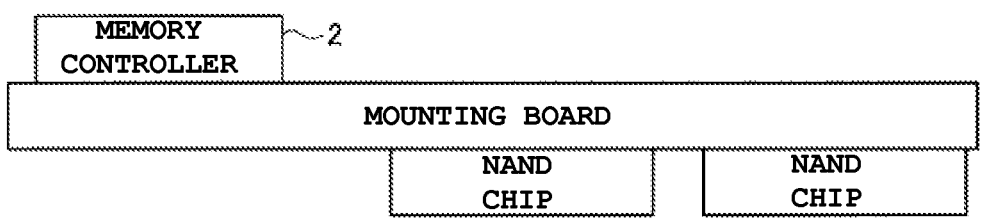
Figure 5:
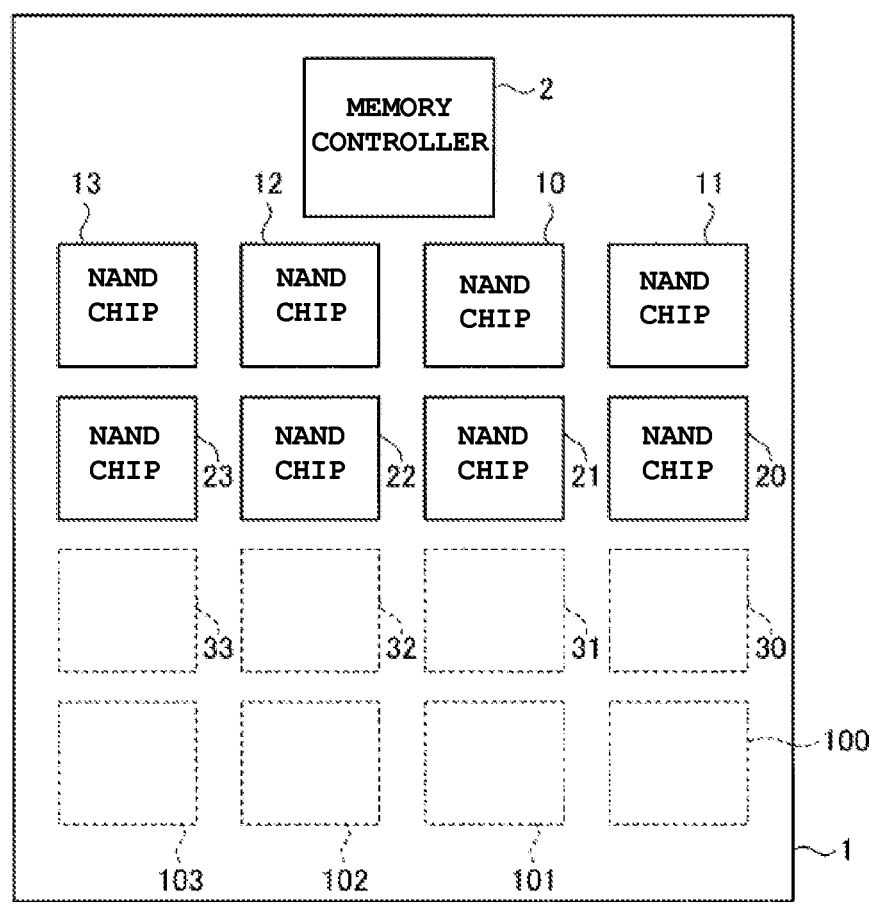
Figure 6:
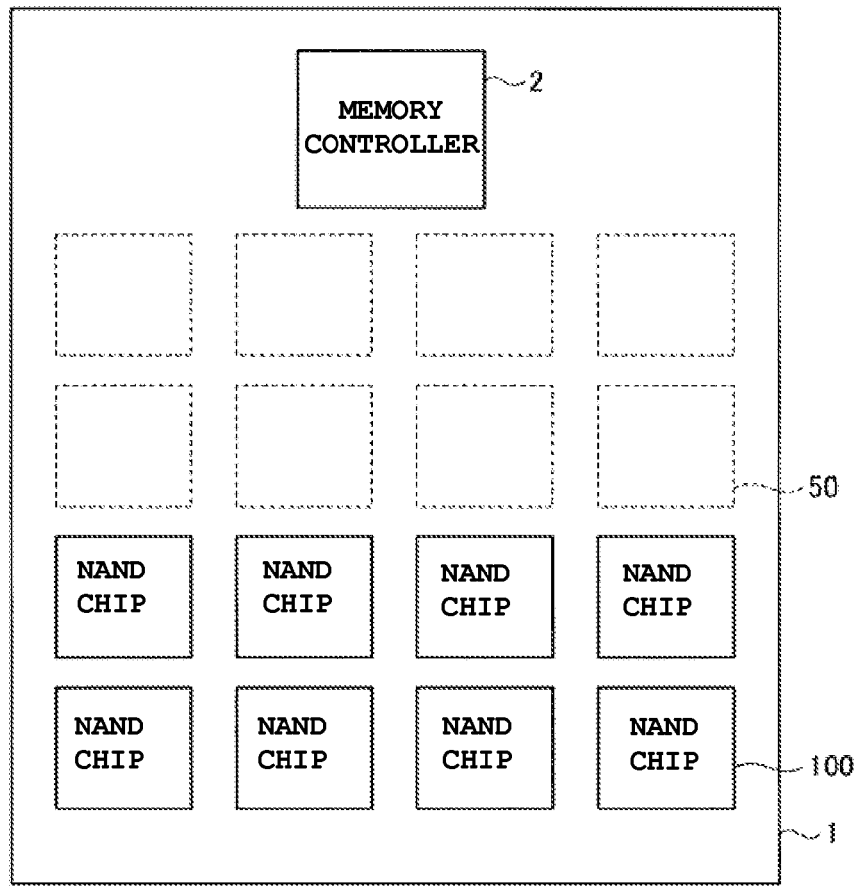
Figure 7:
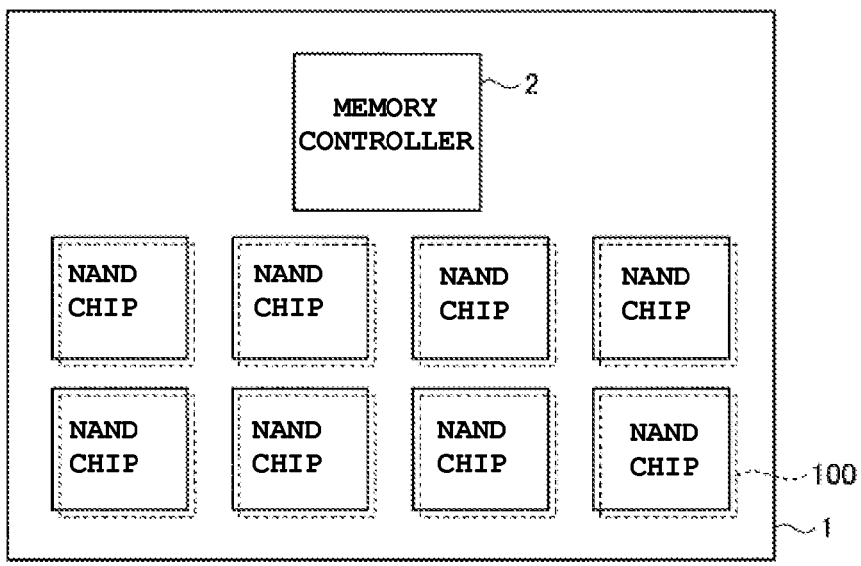
FIG. 7-FIG. 14 are schematic diagrams that show additional configurations of the memory system and the arrangement of the memory controller and the NAND chips.

As a configuration of the memory system 1 that focuses on the arrangement of the memory controller 2 and the NAND chips, a variation as shown not only in FIG. 1 but also in FIG. 2 to FIG. 14 can be considered. In FIGS. 3, 5 and 6, the boxes shown in dotted lines represent the NAND chips arranged opposite to the memory controller 2 with a mounting board in between, as shown in FIG. 4, while the boxes shown in solid lines represent the NAND chips arranged on the same side of the mounting board as the memory controller 2.

In the case of FIG. 2, FIG. 3, and FIG. 5 to FIG. 14, the firmware or management data is written in the NAND chip 100, which is located the farthest from the memory controller 2. However, for example, as shown in FIG. 6, the NAND chip 100 is located on the same side of the mounting board as the memory controller 2. In terms of physical distance, the NAND chip 100 is located the farthest from the memory controller 2. However, when the heat blocking effect of a mounting board is considered, the NAND chip 50, which is located in the back of the mounting board, is the least affected by the thermal influence of the memory controller 2. In this case, the firmware or management data may be written in the NAND chip 50.

(Second Embodiment)

In a nonvolatile semiconductor memory storage, although data is generally written by a multi-value recording (MLC) system of ternary or higher, those that are written by a binary recording (SLC) system also exist, for example, depending on the data, such as system data, etc. The binary recording (SLC) system has a greater degradation tolerance as compared to the multi-value recording (MLC) system of ternary or higher. In other words, the binary recording (SLC) system is more reliable than the multi-value recording (MLC) system of ternary or higher.

Figure 15:
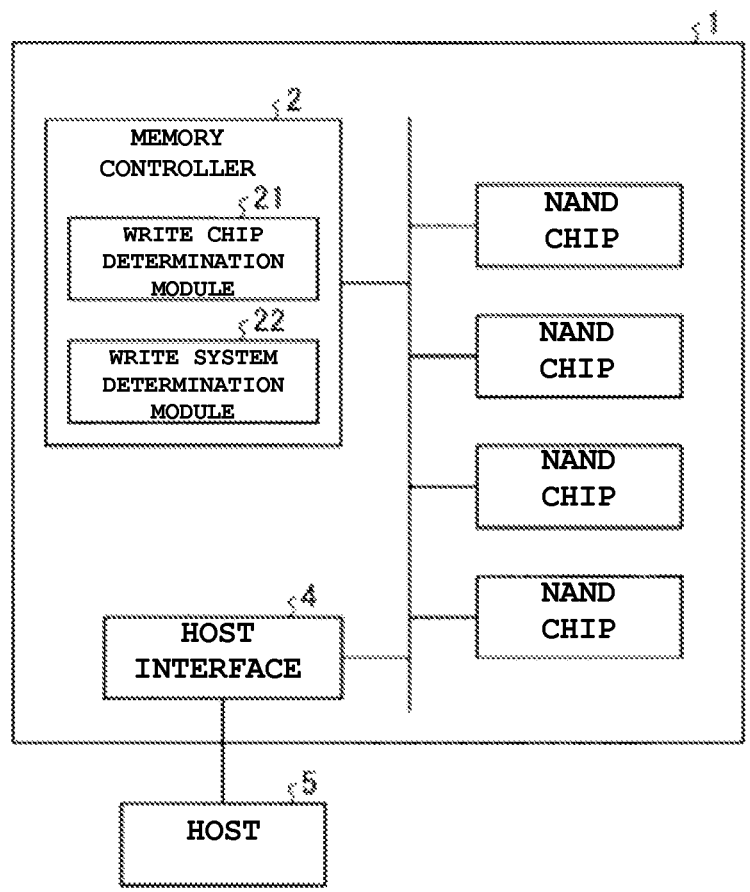
FIG. 15 is a schematic diagram that shows a configuration of a memory system according to a second embodiment.

A memory system 1 (memory device) according to this embodiment is shown in FIG. 15. The data is written in the NAND chip located close to the memory controller 2, which is easily subject to thermal influence, by a binary recording (SLC) system, and the data is stored in the NAND chip located far from the memory controller 2, which is minimally subject to thermal influence, as a multi-value recording (MLC) system of ternary or higher. In this way, the degradation characteristic of the memory system 1 as a non-volatile semiconductor memory storage device can be optimized. That is, if the memory controller 2 receives the data writing instruction from a host 5 through a host interface 4, a write chip determination module 21 will decide which NAND chip that data is to be written to.

Depending on the NAND chip that has been decided by the write chip determination module 21, the write system determination module 22 writes the data in the NAND chip located the closest to the memory controller 2, which is the most easily affected by heat, by a binary recording (SLC) system, and writes the data in the NAND chip located the farthest from the memory controller 2, which is the minimally affected by heat, by a multi-value recording (MLC) system of ternary or higher.

Or, a write system determination module 22 will write the data by the binary recording (SLC) system to the NAND chip in which the write chip determination module 21 has determined that the distance of the NAND chip from the memory controller 2 is below a predetermined value, and when that value is larger than the predetermined value, the data will be written in the NAND chip by the multi-value recording (MLC) system of ternary or more. The predetermined value is based on the distance of each of the NAND chips from the memory controller 2.

A concrete example of the writing by the write system determination module 22 is described below.

For example, in the example shown in FIG. 1, the data is written by the binary recording system in the NAND chips 10-14, including the NAND chip 10 located the nearest to the memory controller 2, and the data is written by a quaternary recording system in the NAND chips 15, 16, 100, including the NAND chip 100 located the farthest from the memory controller 2.

Figure 2:
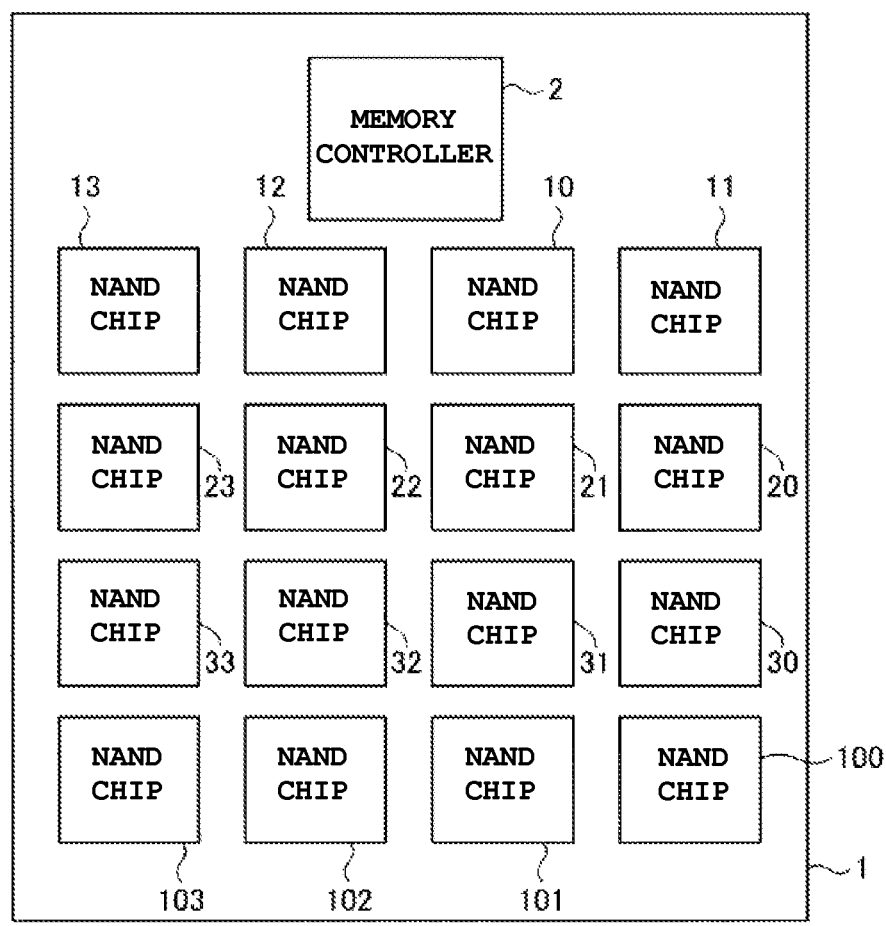
Figure 3:
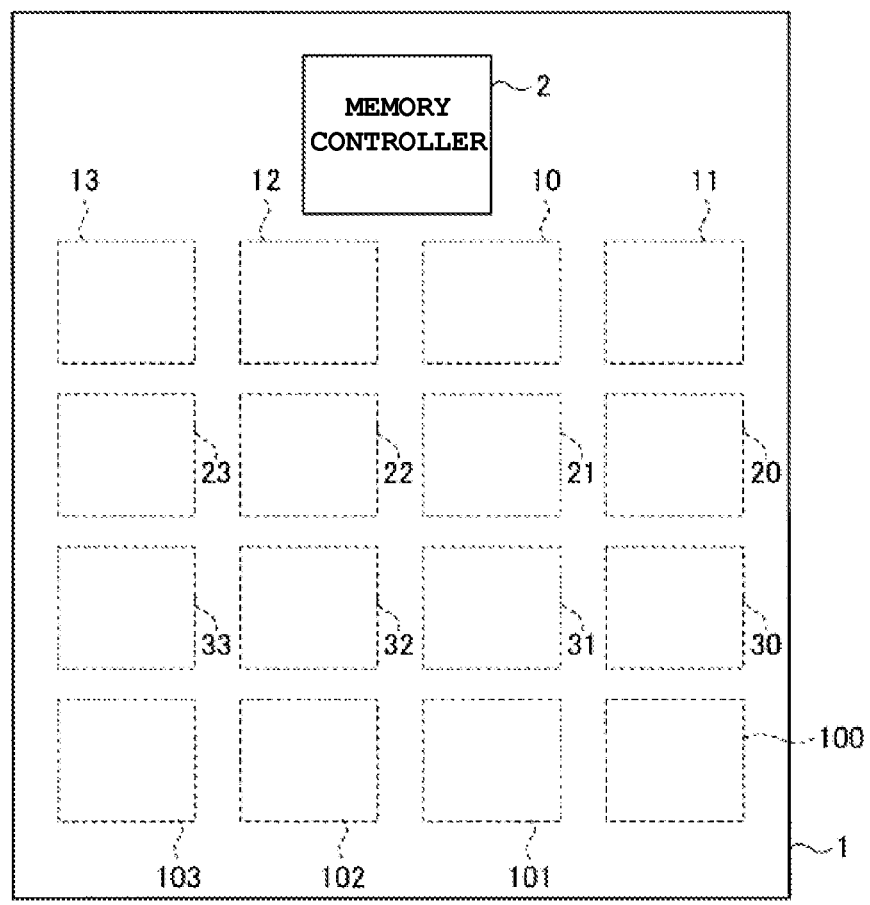

Furthermore, in the example shown in FIG. 2, FIG. 3, and FIG. 5, the data is written by the binary recording system in the NAND chips 10-13, including the NAND chip 10 located nearest to the memory controller 2. The data is also written by the quaternary recording system in the NAND chips 20-23 located the second nearest distance to the memory controller 2. The data is also written by an octonary recording system in the NAND chips 30-33 located the third nearest distance to the memory controller 2. The data is also written by a 16-value recording system in the NAND chips 100-103, including the NAND chip 100 located the farthest from the memory controller 2.

Figure 8:
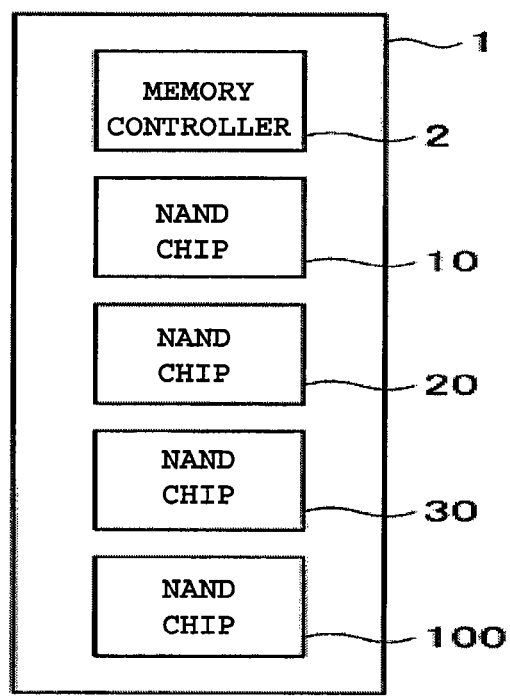
Figure 10:
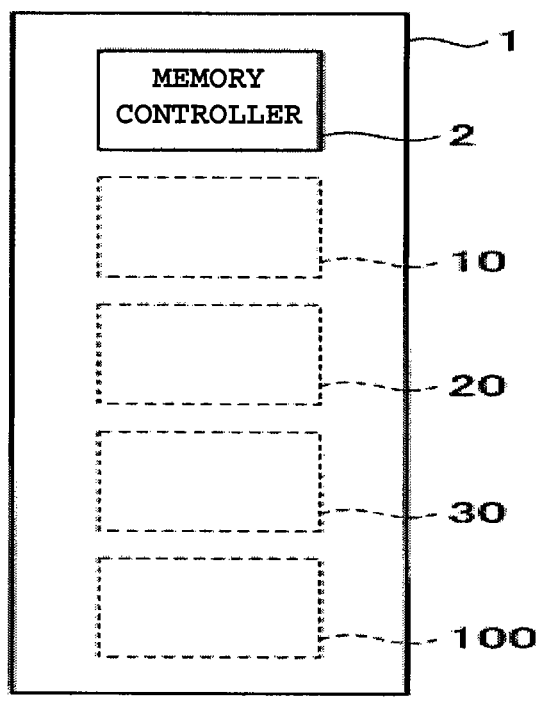
Figure 12:
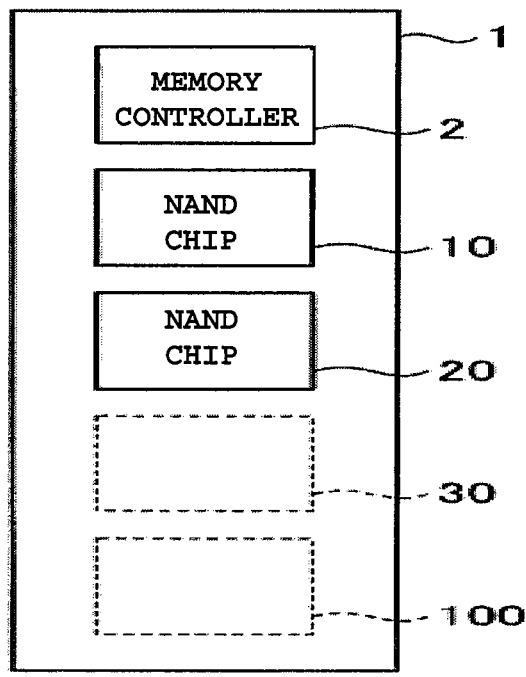
Figure 13:
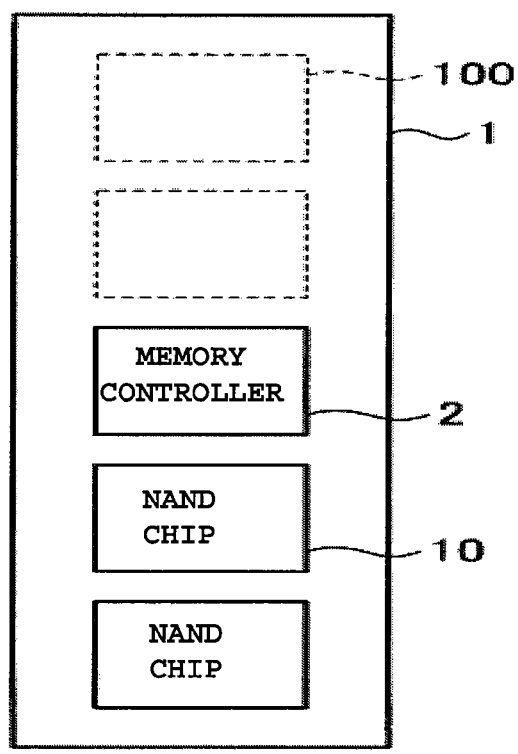
Figure 14:
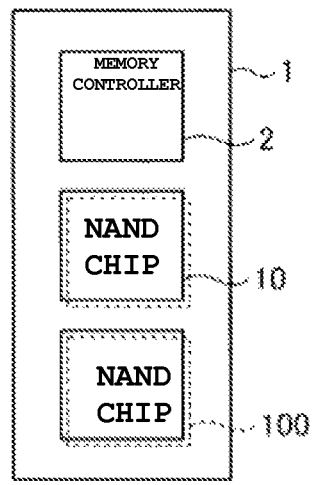

In the examples shown in FIG. 8, FIG. 10, and FIG. 12, the data is written by the binary recording system in the NAND chip 10 located the nearest to the memory controller 2. The data is also written by the quaternary recording system in the NAND chip 20 located the second nearest distance to the memory controller 2. The data is also written by the octonary recording system in the NAND chip 30 located the third nearest distance to the memory controller 2. The data is also written by the 16-value recording system in the NAND chip 100 located the farthest from the memory controller 2.

Figure 9:
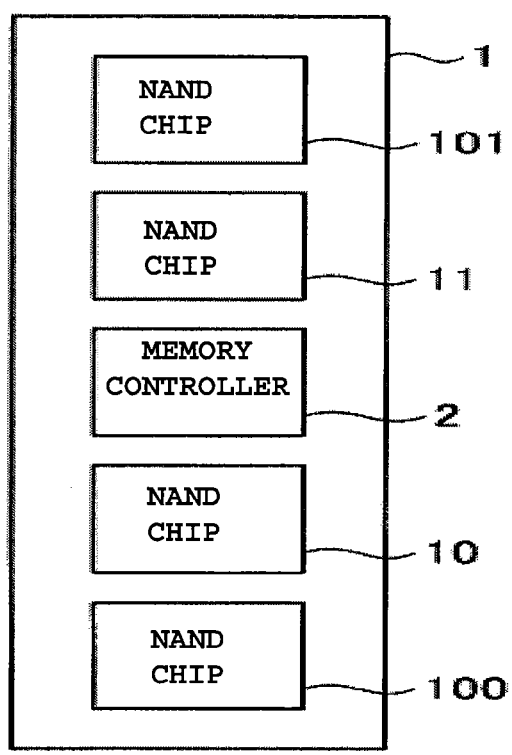
Figure 11:
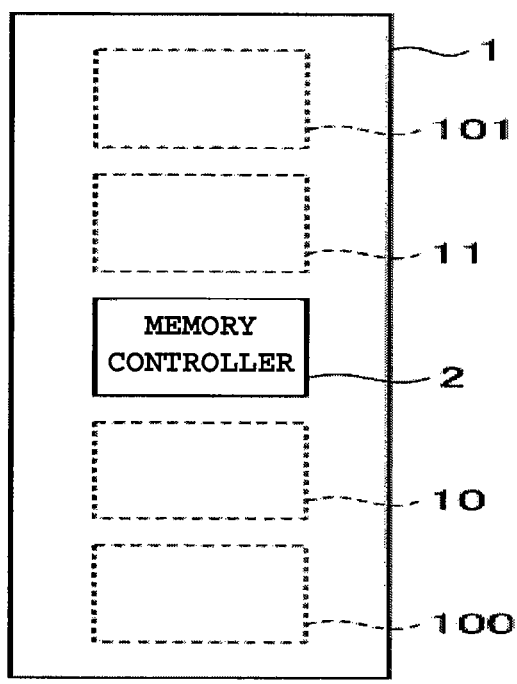

In the examples shown in FIG. 9 and FIG. 11, the data is written by the binary recording system in the NAND chips 10 and 11 located the nearest to the memory controller 2. The data is also written by the quaternary recording system in the NAND chips 100 and 101 located the farthest from the memory controller 2. Moreover, in the examples shown in FIG. 13 and FIG. 14, the data is written by the binary recording system in the NAND chip 10 located the nearest to the memory controller 2. The data is also written by the octonary recording system in the NAND chip 100 located the farthest from the memory controller 2, and in the other NAND chips, the data is written at a level between binary and octonary depending on the degree of heat influence from the memory controller 2.

As explained above, writing is carried out at the lowest level in the NAND chip located the closest to the memory controller 2, and writing is carried out at the highest level in the NAND chip located the farthest from the memory controller 2. With the writing being carried out at the highest level in the NAND chip located the farthest from the memory controller 2, a lesser heat influence is experienced by the NAND chips from the memory controller 2. Therefore, the degradation characteristic of the memory system 1 as a non-volatile semiconductor memory storage can be optimized among the NAND chips.

(Third Embodiment)

Figure 16:
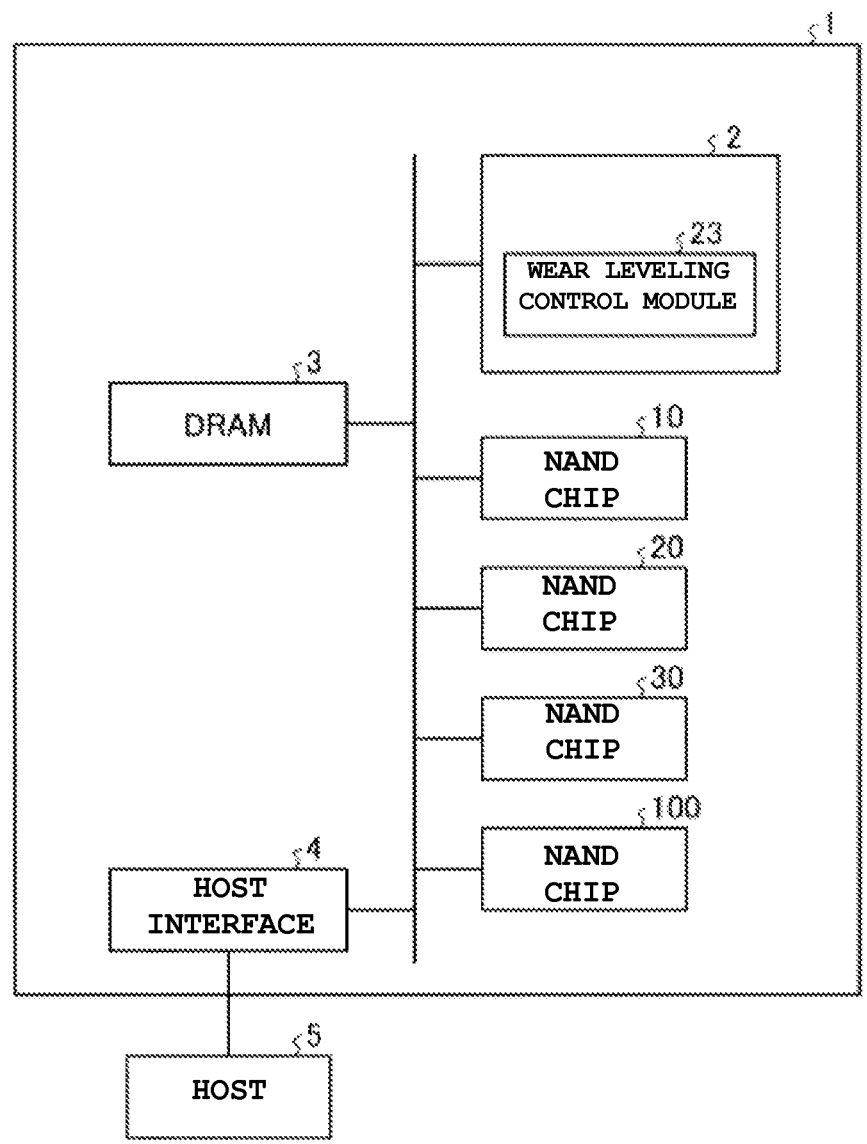
FIG. 16 is a schematic diagram that shows a configuration of a memory system according to a third embodiment.

The configuration of the memory system 1 concerning this embodiment is shown in FIG. 16. In writing from the host 5, carrying out wear leveling, which is the average of the number of times of writing among NAND chips 10, 20, 30, 100, by a wear leveling control module 23, will nearly average the frequency of writing of the NAND chips 10, 20, 30, 100 in the memory system 1. By doing so, the frequency of use will be averaged regardless of the distance between the memory controller 2 and the NAND chips 10, 20, 30, 100. This will pose no problem if the temperature changes stay the same among several NAND chips 10, 20, 30, 100 independent of position or location of the chips; however, in reality, the temperature changes vary depending on the location of several NAND chips 10, 20, 30, 100, on a substrate, so the NAND chip located close to the memory controller 2 is easy to be at high temperature due to heat influence.

When the temperatures vary from high temperature to low temperature based on the order of location from the memory controller 2, that is, in the order of NAND chips 10, 20, 30, 100, the example of the data retention lifetime (data retention) with respect to the number of times of writing of each NAND chip is shown in FIG. 17. That is, the NAND chip 10 considered to be the most likely to reach the highest temperature is indicated by A as shown in FIG. 17, the NAND chip 20 is indicated by B, the NAND chip 30 by C, and the NAND chip 100 by D. As indicated by A, the lifetime of the NAND chip 10 subjected to the highest temperature will include 500 times of writing in one year. As indicated by D, the remaining lifetime of the NAND chip 100 subjected to the lowest temperature will include 3000 times of writing in one year.

Taking this into consideration, in order to carry out average write frequency, the weighting factor table shown in FIG. 18, that stores the weighting factor of every NAND chip influenced by heat depending on its distance from the memory controller 2 or the like, is retained in a volatile memory, such as DRAM 3 (shown in FIG. 16). As shown in the weighting factor table of FIG. 18, the weighting factor "10" indicated by A is assigned to the NAND chip 10, the weighting factor "5" indicated by B is assigned to the NAND chip 20, the weighting factor "2" indicated by C is assigned to the NAND chip 30, and the weighting factor "1" indicated by D is assigned to the NAND chip 100. When the memory controller 2 carries out writing in each NAND chip, the memory controller 2 will monitor the writing frequency per this weighting factor by a writing frequency counter that is controlled by DRAM 3, etc. for each NAND chip 10, 20, 30, 100.

Namely, the NAND chip 100 with the least heat influence from the memory controller 2 only needs to be counted once at one writing, while the NAND chip 10 with the greatest heat influence is counted ten times at one writing. However, the wear leveling control module 23, that controls which NAND chip is to be written by wear leveling, chooses a NAND chip by the usual wear leveling technique so that the frequency of the writing frequency counter becomes average without variation. In this embodiment, a large weighting factor is assigned to the NAND chip with the greatest heat influence, as shown in FIG. 18. By doing so, storage retention characteristic degradation of the NAND chip due to the heat from the memory controller 2 can be averaged among the NAND chips by carrying out the usual wear leveling method, enabling the entire memory system 1 to receive minimal influence of memory retention characteristic degradation due to the heat from the memory controller 2.

Also in the case of the FIGS. 1-3 and FIGS. 5-14, the larger the heat influence to the NAND chip located the closest to the memory controller 2, the larger the weighting factor will be assigned to the NAND chip. By doing so, storage retention characteristic degradation of the NAND chip due to the heat from the memory controller 2 can be averaged among the NAND chips by carrying out the wear leveling, enabling the entire memory system 1 to receive minimal influence of memory retention characteristic degradation due to the heat from the memory controller 2.

In addition, although the above-mentioned embodiment explains the NAND flash memory as an example for a nonvolatile memory chip, other kinds of nonvolatile memory chips may be adopted. For example, a NOR-type flash memory, FeRAM (Ferro Electric Random Access Memory), MRAM (Magnetoresistive Random Access Memory), ReRAM (Resistive Random Access Memory), etc. may be adopted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
a substrate;
a plurality of nonvolatile memory chips disposed on the substrate;
a memory controller disposed on the substrate, the memory controller comprising a wear leveling control module; and
a memory that stores
a weighting factor table that includes a weighting factor for each of the plurality of nonvolatile memory chips, the weighting factor for each nonvolatile memory chip being assigned based on the distance of the nonvolatile memory chip from the memory controller, the weighting factor being greater for nonvolatile memory chips that are closer to the memory controller, and
a writing frequency counter for each of the plurality of nonvolatile memory chips, wherein:
the memory controller selects a nonvolatile memory chip to be written from the plurality of nonvolatile memory chips and increases a writing frequency stored in the writing frequency counter for the selected nonvolatile memory chip according to the weighting factor assigned to the selected nonvolatile memory chip.

2. The memory device of claim 1, wherein the memory controller controls each of the nonvolatile memory chips based on a firmware, wherein the firmware is written in a nonvolatile memory chip positioned at a location farthest from the memory controller.

3. The memory device of claim 2, wherein the firmware is written using a binary recording system.

4. The memory device of claim 1, wherein at least a portion of the plurality of nonvolatile memory chips are disposed on the same side of the substrate as the memory controller.

5. The memory device of claim 4, wherein the plurality of nonvolatile memory chips are disposed in a line on the substrate.

6. The memory device of claim 1, wherein at least a portion of the plurality of nonvolatile memory chips are disposed on a side of the substrate opposite to the memory controller.

7. The memory device of claim 1, wherein the wear leveling control module averages the writing frequency for each of the plurality of nonvolatile memory chips.

8. The memory device of claim 1, wherein the memory controller is disposed at a position on the substrate that is closer to an edge of the substrate than each of the nonvolatile memory chips.

9. The memory device of claim 1, wherein the memory that stores weighting factor table and the writing frequency counters is volatile memory.

10. The memory device of claim 1, wherein the largest weighting factor is assigned to one of the nonvolatile memory chips that has the highest operating temperature, and the smallest weighting factor is assigned to another one of the nonvolatile memory chips that has the lowest operating temperature.

* * * * *